United States Patent [19]
Habermeier et al.

[11] Patent Number: 5,793,092
[45] Date of Patent: Aug. 11, 1998

[54] THERMOELECTRIC RADIATION DETECTORS BASED ON PEROVSKITE DOPED FILMS AND SUPERLATTICES

[75] Inventors: Hanns-Ulrich Habermeier; Gerold Jäger-Waldau, both of Stuttgart; Bernd Leibold, Kirchheim-Ötlingen, all of Germany; Najeh Jisrawi, Upton, N.Y.

[73] Assignee: Max-Planck-Gesselschaft, Munich, Germany

[21] Appl. No.: 532,321

[22] Filed: Sep. 22, 1995

[30] Foreign Application Priority Data

Sep. 29, 1994 [DE] Germany ............... P 44 34 904.1

[51] Int. Cl.⁶ ............... H01L 31/0264; H01L 31/058
[52] U.S. Cl. ............... 257/467; 257/22; 505/161; 505/181
[58] Field of Search ............... 257/467, 22; 505/161, 505/181

[56] References Cited

U.S. PATENT DOCUMENTS 5,241,191   8/1993   Agostinelli ............... 257/33

FOREIGN PATENT DOCUMENTS

| | | |
|---|---|---|
| 0 296 706 | 12/1988 | European Pat. Off. |
| 38 44 207 A1 | 7/1990 | Germany |
| 43 06 497 A1 | 7/1993 | Germany |
| 93 16 185.9 | 5/1994 | Germany |
| 6-61532 | 3/1994 | Japan ............... 257/467 |

OTHER PUBLICATIONS

Kwok, et al., "Anomalous photovoltaic response in $YBa_2Cu_3O_7$", (1992), pp. 3692–3695, *Physical Review B*, vol. 46, No. 6.

Takayama, et al., "Superconductivity of $YBa_2CU_{3-x}M_xO_y(M=Co, Fe, Ne, Zn)$", (1987), pp. L2087–L2090, *Japanese Journal Of Applied Physics*, vol. 26, No. 12.

Gomeniuk, et al., "Effect of Strong Electrostatic Fields on the Properties of $Y_{1-x}Pr_xBa_2Cu_3O_{7-\delta}$ Ceramics"; (1992), pp. 155–161, *Phys. Stat. Sol. (a)*, vol. 132.

Tatsumi, et al., "Electrical and Magnetic Properties of the High-$T_c$ Superconductors $(Y_{1-x}M_x)Ba_2CU_3O_y$ and $Y(Ba_{1-x}M_x)_2Cu_3O_y$(M=Mg, Ca, Sr, Ba)", (1992), pp. L392–L395, *Japanese J. Appl. Phys*, vol. 31, part 2, No. 4A.

L. Correra, "preparation of Thin Films of $CeO_2$ by MOCVD", (1992), pp. 715–720, *High $T_c$ Superconductor, Thin Films*, Elsevier Science Publishers B.V.

Tarascon, et al., "Preparation, structure, and properties of the superconducting compound series $Bi_2Sr_2Ca_{n-1}O_y$ with n=1, 2, and 3", (1988) pp. 8885–8892, *Physical Review B*, vol. 38, No. 13.

Jia, et al., "Interactions between superconducting $YBa_2Cu_3O_{7-x}$ and silicon using different buffer layers", (1991), pp. 3364–3366, *J. Appl. Phys.*, vol. 70.

Pilat, et al., "A radiation pyrometer using anisotropic thermoelectric elements", (1974), pp. 273–274, *Sov. J. Opt. Technol.*, vol. 41, No. 5.

Lengfellner, et al., "Giant voltages upon surface heating in normal $YBa_2Cu_3O_{7-\delta}$ films suggesting an atomic layer thermopile", (1992), pp. 501–503, *Appl. Phys. Lett.*, vol. 60.

(List continued on next page.)

*Primary Examiner*—Jerome Jackson
*Attorney, Agent, or Firm*—Frishauf, Holtz, Goodman, Langer & Chick, P.C.

[57] ABSTRACT

A thermoelectric radiation detector having a substrate (1) and a film (2) of solid state material having thermal anisotropy and containing $YBa_2Cu_3O_7$, formed on the surface of the substrate, and wherein said film has $CuO_2$ planes (3) inclined with respect to the substrate plane, the improvement wherein at least a portion of the Y is replaced by another rare earth metal and/or at least a portion of the Ba and/or of the Cu is replaced by at least one other heavy metal at least in partial areas of the film and in a sufficient amount to increase the thermal anisotropy of the detector.

16 Claims, 2 Drawing Sheets

OTHER PUBLICATIONS

Paulius, et al., "Enhancement of flux pinning by Pr doping in $Y_{1-x}Pr_xBa_2Cu_3O_{7-\delta}(0 \leq x \leq 0.4)$", (1993), pp. 11 627–11 630, *Physical Review B*, vol. 47, No. 17.

Levey, et al., "Optically detected transient thermal response of high $T_c$ epitaxial films", (1991), pp. 126–128, *Appl. Phys. Lett.*, vol. 60.

L. Correra, "Superconducting Properties and Two Dimensional Transport Behavior in $YBa_2Cu_3O_7$ based Superlattices", (1992), pp. 13–23, *High $T_c$ Superconductor Thin Films*, Elsevier Science Publishers B.V.

THERMOELECTRIC RADIATION DETECTORS BASED ON PEROVSKITE DOPED FILMS AND SUPERLATTICES

FIELD OF THE INVENTION

The invention relates to a thermoelectric radiation detector which generates a voltage signal because of thermal anisotropy in the film layer(s).

DESCRIPTION OF THE RELATED ART

From German laid-open patent 43 06 497, it is known that a film of a crystalline solid-state material having anisotropic thermoelectric force, e.g., YBaCuO (more specifically $YBa_2Cu'O_7$) applied to a suitable substrate (e.g., $SrTiO_3$) may be employed as a thermoelectric detector. The prerequisite for this is that the $CuO_2$ planes of $YBa_2Cu_3O_7$ include an angle α with respect to the surface of the film or substrate. Such an arrangement can be appreciated as an intrinsic thermopile made up of a plurality of thermocouples of $CuO_2$ planes and intermediate layers (see FIG. 1). The minimum detectable radiant flux is dictated by the sensitivity of the radiation detector which, in radiation detectors in the field concerned, is of the order of 100 mV/K. In addition, due to the fact that they operate in the normal-conducting condition, prior art thermoelectric radiation detectors are restricted to the temperature range above the transition temperature of the superconductor $YBa_2Cu_3O_7$.

SUMMARY OF THE INVENTION

The object of the present invention is thus based on improving the range of application of a radiation detector in the field concerned. More particularly, the invention is based on the object of increasing the sensitivity and the temperature range of employment of radiation detectors in the field concerned. Referring to FIG. 1, this object is achieved by thermoelectric radiation detector having a substrate (1) and a film (2) of $YBa_2Cu_3O_7$ formed on the surface of the substrate, in which the said film of which the $CuO_2$ planes (3) are inclined with respect to the substrate plane, the improvement wherein at least a portion of the Y is replaced by another rare earth metal and/or at least a portion of the Ba and/or of the Cu is replaced by at least some other heavy metal at least in partial areas of the film in a sufficient amount to increase the thermal anisotropy of the detector.

The invention enables the sensitivity of a radiation detector in the field concerned to be enhanced by more than one order of magnitude. This is achieved by employing, instead of pure $YBa_2Cu_3O_7$, as proposed in the prior art, doped $YBa_2Cu_3O_7$. Instead of YBaCuO, other perovskite-type materials having elevated intrinsic electronic anisotropy, e.g., $Bi_mC_{n-1}Sr_nCu_nO_{2n+m+2}$ where m=1 or 2 and n=1, 2 or 3 may be employed. Further advantageous embodiments of a radiation detector in accordance with the present invention consist of producing superlattices of the cited and other perovskite-type materials.

BRIEF DESCRIPTION OF THE DRAWING

The invention is described in detail in the following with reference to the Figures, in which.

DESCRIPTION OF THE PREFERRED EMBODIMENTS

Figure 1:
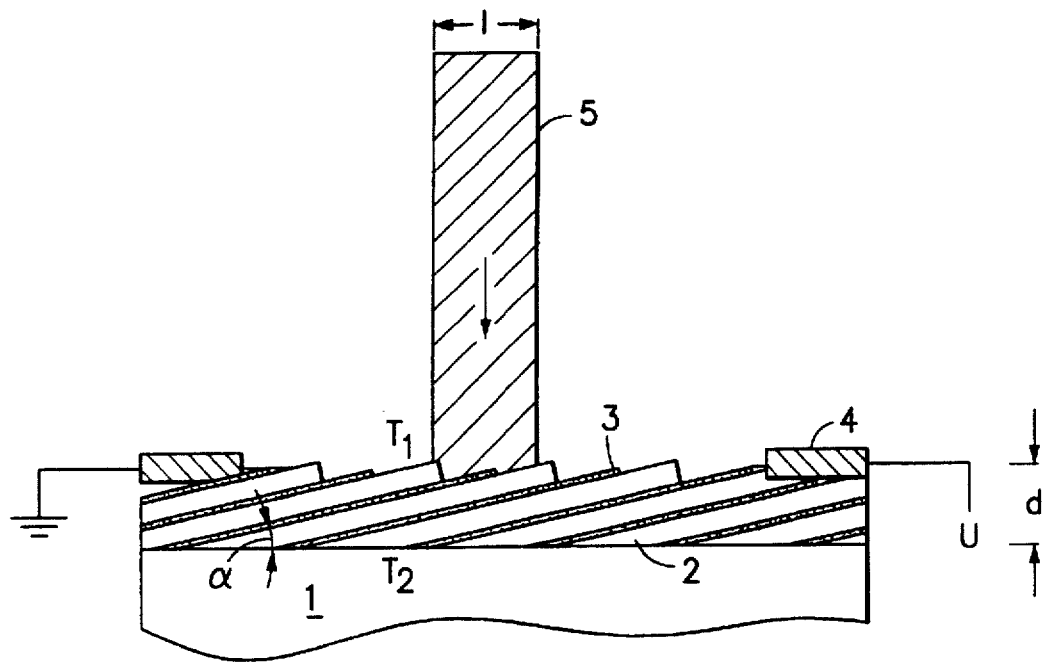
FIG. 1 illustrates the configuration and functioning of a thermoelectric radiation detector in the field concerned.

In FIG. 1, a radiation detector in accordance with the invention is shown schematically. The structure known in the field is of the type described, e.g., in detail in German laid-open patent 43 06 497. In general, a suitable substrate 1, a film 2 of a crystalline solid state material is deposited in a thickness d. This anisotropy may consist of, e.g., the high-temperature superconductor $YBa_2Cu_3O_7$ where the crystal planes 3 correspond to $CuO_2$ planes which are arranged sequentially as a family of planes in the direction of the c axis of the material. The $CuO_2$ planes of $YBa_2CU_3O_7$ are preferably tilted at about an angle α=450° with respect to the film plane. The continuous or pulsed radiation 5 to be detected incident at the surface of the film is absorbed in a region of the film near to the surface, and converted into thermal energy at least in part. Accordingly, a temperature gradient δT/δz is generated perpendicular to the film plane. As a result of the anisotropy of the thermoelectric force, a voltage U occurs in the direction parallel to the film which may be tapped by means of a suitable arrangement of electrodes. The voltage U is given by $$U=(1/d)\cdot \Delta S \cdot \Delta T \cdot \sin \alpha$$

where ΔS is the difference of the Seebeck coefficients along and perpendicular to the crystallographic c axis of $YBa_2Cu_3O_7$, $\Delta T = T_1-T_2$ the temperature difference, 1 the diameter of the irradiated surface and d the thickness of the film. If pure $YBa_2Cu_3O_7$ is employed as the film material in the field concerned, sensitivities in the order of magnitude 0.1 V/K may be achieved. However, by doping the $YBa_2Cu_3O_7$ films, the sensitivity of the radiation detector may be considerably enhanced.

Figure 2:
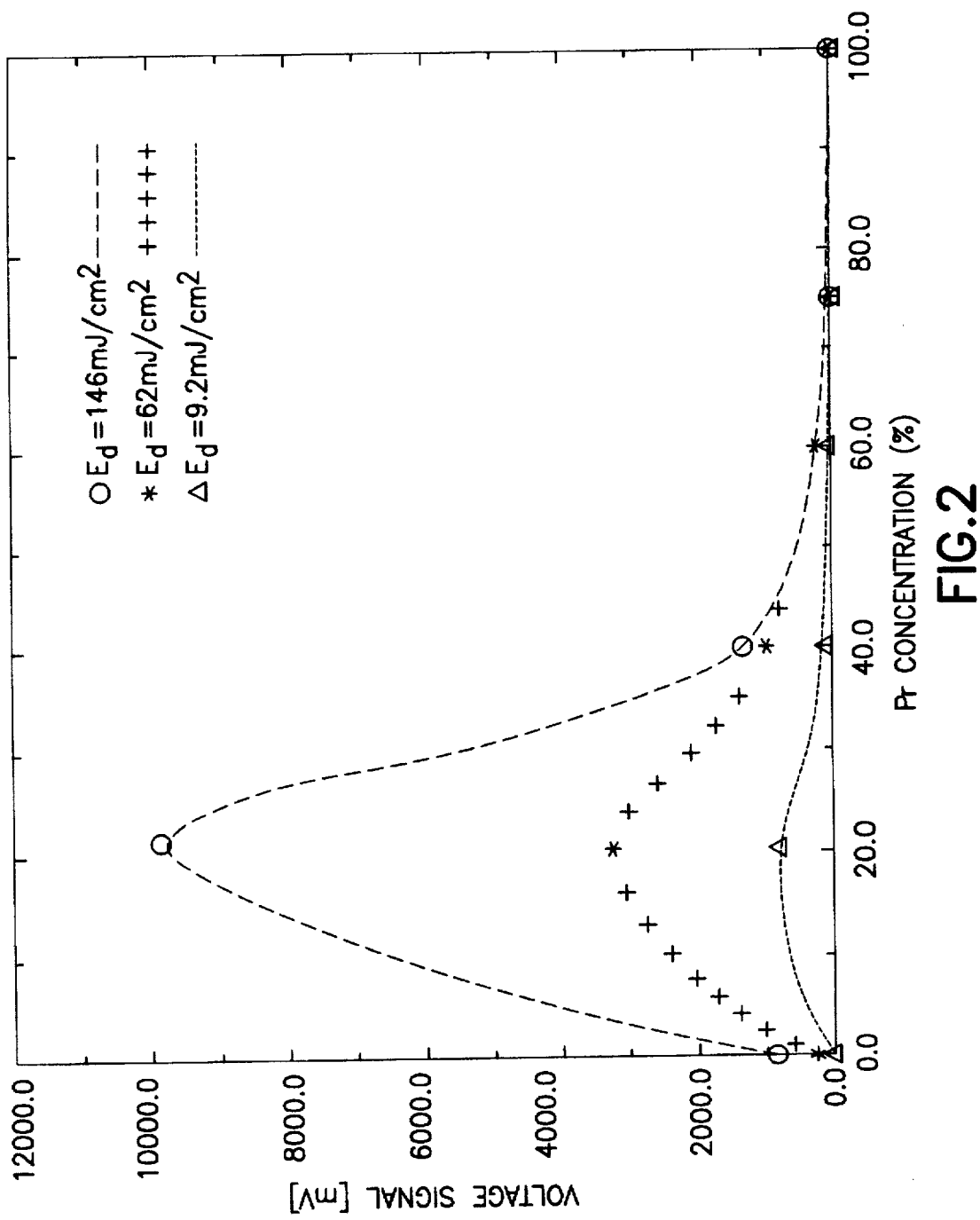
FIG. 2 is a graph showing the voltage signal of a $YBa_2Cu_3O_7$ radiation detector in accordance with the invention as a function of the Pr dopant concentration at various radiation energy densities.

In FIG. 2 the voltage signal of the radiation detector having a film of $Y_{(1-x)}Pr_xBa_2Cu_3O_7$ is plotted as a function of the praseodymium concentration. The variable parameter of the curves is the radiation energy density $E_d$. The voltage signal is a maximum at x=0.2 (i.e., 20% Pr concentration) and corresponds to a sensitivity >1 V/K of the detector.

The test results in FIG. 2 for a film of $Y_{(1-x)}Pr_xBa_2Cu_3O_7$, show that an approximately two-fold increase in voltage signal is obtained with only an approximately 20% (x=0.02) Pr substitution. The voltage signal rapidly rises to about a factor of 20 at about 20% (x=0.2) Pr substitution and falls off again to about a two-fold increase over 0% substitution when the substitution amount reaches about 40% (x=0.4). Thus, preferred substitution of Pr for Y molecules are about 2% (x=0.02) to about 40% (x=0.4), more preferably 10% (x=0.1) to 30% (x=0.3), with about 20% (x=0.2) giving maximum results. Normally, in manufacturing such devices, one would not go much above 20% to avoid unnecessary use of dopant.

Figure 3:
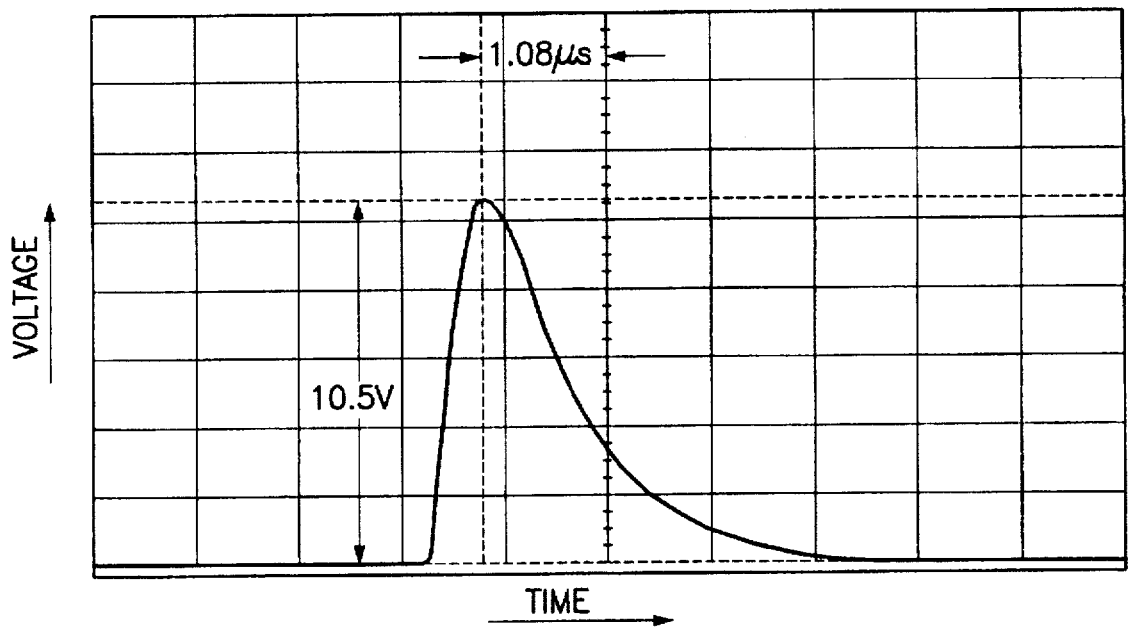
FIG. 3 is a graph showing the output signal of the radiation defector in accordance with the invention as a function of time hen irradiated by a KrF laser pulse.

FIG. 3 is a graph showing the voltage signal of a radiation detector having a film of $Y_{0.2}Pr_{0.8}Ba_2Cu_3O_7$ (20% replacement of Pr by Y) as a function of time, irradiated with the light of a KrF examiner laser (pulse length 28 ns, energy density 170 m J/cm²). From this measurement, it is clear that a response or repetition rate >1 MHz may be achieved which is determined by the thermal decay of the signal.

By enhancing the sensitivity of the radiation detector by more than a factor of 20, it can thus be employed also for measuring relative low radiant flux of electromagnetic or corpuscular radiation when this results in a local increase in temperature at the film surface.

By means of the detector according to the invention, noncontact temperature measurement may be implemented, when one side of the sensor is exposed to a temperature different from the other and thus causes a temperature gradient perpendicular to the plane of the film.

In the example embodiment as described above, a partial substitution of the yttrium by praseodymium is employed. However, instead of praseodymium, any other rare earth metal may be used for doping.

Instead of partial substitution of the yttrium or, in addition thereto, the barium may also be partially substituted by other alkali earth metals and/or the copper may be partially substituted by other heavy metals.

For the employment of a radiation detector according to the invention, it is necessary that the active layer is in the normal-conducting condition. From this aspect, doping the $YBa_2Cu_3O_7$ with a suitable substitute has the further advantage that the superconductivity of the pure $YBa_2Cu_3O_7$ film is suppressed and, in this way, sensors/detectors having, on the one hand, greater sensitivity and, on the other, an extended temperature range (liquid helium up to room temperature) may be produced.

Instead of $YBa_2Cu_3O_7$ the series of homologous Bi—Sr—Ca—Cu—O compounds generally formulated as $Bi_mCa_{n-1}Sr_nCu_nO_{2n+m+2}$ where m=1 or 2 and n=1, 2 or 3 which is closely related to the above material, both structurally and electronically, may also be employed as the active film material. These compounds exhibit a very high intrinsic, electronic anisotropy (perpendicular/parallel to the $CuO_2$ planes) and are thus strongly anisotropic in their thermoelectric force. By suitably selecting the percentage factors n and m, the maximum in the anisotropy of this material can be found. Then, a compromise between adequate sensitivity and an appropriate transition temperature can be made.

How Pr doping in $YBa_2Cu_3O_7$ relates to the increase in the thermoelectric force is still awaiting a scientific explanation; however, there are strong indications that the depletion in hole concentrations in the $CuO_2$ planes associate with Pr doping results in an increase in the Seebeck coefficient.

In a further embodiment of the present invention, instead of a film material having a spatially homogenous dopant concentration or homogenous concentration of Y, Ba, Cu, O or substitutes thereof, a superlattice of two different materials A and B may be produced. A being, for example, pure $YBa_2Cu_3O_7$ and B being $PrBa_2Cu_3O_7$. Instead of completely substituting the yttrium in material A, a partial substitution may also be employed. This is preferably at least 2%. The superlattice may also be made up of the Bi—Sr—Ca—Cu—O compounds described above, the materials differing from each other by selecting the concentration factors n and m (see general formula supra) differently. The material A or B can also be some other perovskite-type oxidic material, for example strontium titanate ($SrTiO_3$).

Thus, embodiment of the thermoelectric radiation detector having a substrate (1) and a film (2) of $YBa_2Cu_3O_7$ formed on the surface of the substrate, in which the film of which the CuO planes (3) are inclined with respect to the substrate plane, and the Y is substituted at least in part by some other rare earth metal and/or the Ba and a Cu by at least some other heavy metal at least in partial areas of the film, is characterized in that said film is a superlattice of an alternating sequence of layers of the materials A and B, at least for one of said materials A or B the constituents Y and/or Ba and/or Cu being substituted at least partially.

Superlattices of this kind have the advantage that they permit a tailored increase in the anisotropy which may also be associated with a reduction in the hole concentration in the $YBa_2Cu_3O_7$ film by a charge transfer at the interface between $YBa_2Cu_3O_7$ and PrBaCuO.

Irrespective of the type of active film, silicon may be employed as a relatively inexpensive substrate material which permits the growth of the sensor layers in the desired orientation by deposition of suitable buffer layers (e.g., $ZrO_2$ or $CeO_2$).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In a thermoelectric radiation detector having a substrate (1) and a film (2) of solid state material having thermal anisotropy and containing $YBa_2Cu_3O_7$, formed on the surface of the substrate, and wherein said film has $CuO_2$ planes (3) inclined with respect to the substrate plane, the improvement 2–40% Y is replaced by Pr to increase the thermal anisotropy of the detector.

2. The thermoelectric radiation detector as set forth in claim 1, wherein approximately 10–30% Y is replaced by Pr.

3. The thermoelectric radiation detector as set forth in claim 1, wherein up to approximately 20% Y is replaced by Pr.

4. The thermoelectric radiation detector as set forth in claim 1, wherein approximately 20% Y is replaced by Pr.

5. The thermoelectric radiation detector as set forth in claim 1, wherein said film is a superlattice of an alternating sequence of layers of materials A and B and at least for one of said materials A or B the constituent Y is replaced in a sufficient amount to increase the thermal anisotropy.

6. The thermoelectric radiation detector as set forth in claim 5, wherein said of an constituent Y is replaced in an amount of 2%.

7. The thermoelectric radiation detector as set forth in claim 5, wherein approximately 10–30% Y is replaced by Pr.

8. The thermoelectric radiation detector as set forth in claim 5, wherein approximately 20% Y is replaced by Pr.

9. The thermoelectric radiation detector as set forth in claim 1, wherein the partial substitution is achieved such that the superconductivity of pure $YBa_2Cu_3O_7$ is suppressed.

10. A thermoelectric radiation detector having a substrate (1) and a film (2) of $Bi_mCa_{n-1}Sr_nCu_nO_{2n+m+2}$ formed on the surface of the substrate, in the said film of which the $CuO_2$ planes (3) are inclined with respect to the substrate plane, wherein the concentration factors n and ml n, m are 2,2 or 3,2 respectively such that the anisotropy in the thermoelectric force is a maximum.

11. A thermoelectric radiation detector having a substrate and a film of a crystalline solid-state material having anisotropic thermoelectric force formed on the surface of the substrate, the surface normal of said film not coinciding with one of the main anisotropic directions, wherein said film is configured as a superlattice of an alternating sequence of layers of materials C and D, said material C being a perovskite-type oxidic material, and said material D being $Y_{(1-x)}Pr_xBa_2Cu_3O_7$.

12. The thermoelectric radiation detector as set forth in claim 11, wherein the material C is $Bi_mCa_{n-1}Sr_nCu_nO_{2n+m+2}$ wherein m is 1 or 2 and n is 1, 2 or 3.

13. The thermoelectric radiation detector as set forth in claim 11, wherein material C is $SrTiO_3$.

14. The thermoelectric radiation detector as set forth in claim 1, wherein silicon is employed as said substrate material.

15. The thermoelectric radiation detector as set forth in claim 14, wherein on said silicon substrate, an intermediate or buffer layer is formed.

16. The thermoelectric radiation detector as set forth in claim 15, wherein said intermediate or buffer layer contains $ZrO_2$ or $CeO_2$.

\* \* \* \* \*